(12) United States Patent
Marsall et al.

(10) Patent No.: US 7,808,266 B2
(45) Date of Patent: Oct. 5, 2010

(54) METHOD AND APPARATUS FOR EVALUATING THE EFFECTS OF STRESS ON AN RF OSCILLATOR

(75) Inventors: Andrew Marsall, Dallas, TX (US); Srikanth Krishnan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/352,795

(22) Filed: Jan. 13, 2009

(65) Prior Publication Data

US 2010/0164533 A1 Jul. 1, 2010

Related U.S. Application Data

(60) Provisional application No. 61/141,793, filed on Dec. 31, 2008.

(51) Int. Cl.
*G01R 31/26* (2006.01)
(52) U.S. Cl. .................. 324/765; 331/117 R; 324/158.1
(58) Field of Classification Search ........... 324/761, 324/765, 763, 158.1; 331/117 R
See application file for complete search history.

(56) References Cited

U.S. PATENT DOCUMENTS

| | | | |
|---|---|---|---|
| 6,597,248 B2 * | 7/2003 | Shirai | 331/117 R |
| 6,933,731 B2 * | 8/2005 | Reddy et al. | 324/612 |
| 6,954,111 B2 * | 10/2005 | Muramatsu et al. | 331/117 FE |
| 7,067,842 B1 * | 6/2006 | Jayapalan et al. | 257/48 |
| 7,202,754 B2 * | 4/2007 | Komurasaki et al. | 331/181 |
| 7,218,132 B2 * | 5/2007 | Krishnan et al. | 324/769 |
| 7,605,667 B2 * | 10/2009 | Liu et al. | 331/25 |
| 2003/0162343 A1 * | 8/2003 | Altmann | 438/200 |
| 2007/0018679 A1 * | 1/2007 | Kim | 324/769 |
| 2008/0258827 A1 * | 10/2008 | Tsai | 331/117 R |

* cited by examiner

*Primary Examiner*—Ha Tran T Nguyen
*Assistant Examiner*—Richard Isla Rodas
(74) *Attorney, Agent, or Firm*—Jacqueline J. Garner; Wade J. Brady, III; Frederick J. Telecky, Jr.

(57) ABSTRACT

Apparatus and methods are disclosed for evaluating degradation of a transistor in a cross coupled pair of an RF oscillator independently. A MOS device can be coupled between a separated center-tap inductor. By appropriately sizing the MOS device and turning the MOS device on during operation of RF oscillator, a good contact can again be made that allows the oscillator to operate at design performance. By turning the MOS device off, the supplies can be separates such that I-V characteristics of both transistors of the cross-coupled pair may be obtained.

12 Claims, 3 Drawing Sheets

METHOD AND APPARATUS FOR EVALUATING THE EFFECTS OF STRESS ON AN RF OSCILLATOR

REFERENCE TO RELATED APPLICATION

This application claims priority to and the benefit of U.S. Provisional Application Ser. No. 61/141,793 which was filed Dec. 31, 2008, entitled "Method and Apparatus for Evaluating the Effects of Stress on an RF Oscillator", the entirety of which is hereby incorporated by reference as if fully set forth herein.

FIELD

The present invention relates generally to the field of integrated circuit processing, and more particularly to devices and methods for monitoring degradation of an individual transistor in an oscillator circuit.

BACKGROUND

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly, dense circuit design has not only improved a number of performance characteristics, it has also increased the importance of, and attention to, semiconductor material properties and behaviors.

Through use, the operation of a transistor may degrade over time. There are currently several known modes of transistor degradation. One type of degradation mechanism involves channel hot carriers. In general a high electric field within a transistor causes degradation in the gate oxide. Another degradation mechanism is referred to as negative biased temperature instability degradation.

Commonly device manufacturers specify or define a number of boundary device design parameters (e.g., max/min voltage, max/min current) within which a desired device reliability level may be achieved, or even guaranteed. For example, a semiconductor device may be guaranteed an operational life of 10 years if its supply voltage is maintained at or below 5 Volts over that life. Often, such specifications are derived from a number of characterization tests and simulations performed on sample devices or device structures.

Many end equipment applications demand a guaranteed operational lifetime for a device operating at some fixed set or range of operating conditions. Where a semiconductor manufacturer is supplying devices utilizing a mature fabrication technology, a certain amount of historical data on the actual performance or degradation of the devices over some given lifetime may be available. Frequently, however, the manufacturer is producing the devices utilizing a new, state-of-the-art fabrication technology. In many cases, such technologies have not been in existence long enough to have actual lifetime performance or degradation data compiled. The device manufacturer must, nonetheless, determine some operational device lifetime that it will guarantee.

Manufacturers thus commonly rely on accelerated stress testing of sample device structures or devices. Such structures are dynamically stressed to levels far above their intended operating conditions, and data on critical operational or behavioral parameters at those dynamic stress levels is compiled. That data is then evaluated to develop characterizations or profiles of the device technology, from which the manufacturer may extrapolate to provide some guaranteed lifetime at normal operating conditions.

Unfortunately however, the ability of a manufacturer to accurately characterize certain device operational or behavioral parameters independently has been somewhat limited by conventional characterization methodologies. Depending upon the manufacturing technology and upon the particular device structures being characterized, conventional characterization schemes may limit a manufacturer's ability to vary certain parameters independently during stress testing. As a result, characterizations of two or more parameters are often interdependent. Certain assumptions must then be made regarding the behavior of those parameters with respect to one another in order to evaluate and extrapolate characterization data. In a number of cases, those assumptions introduce a certain margin of error into characterization data. This margin of error can result in, for example, an overestimation or underestimation of the operational lifetime of a production device. Either situation is undesirable, subjecting either the device or end equipment manufacturer to unnecessary system failures or yield losses.

As a result, there is a need for a dynamic stress characterization system that effectively and accurately assesses accelerated testing parameters independently—decoupling variances in operational or behavioral parametric values from one another and providing optimal device characterization in an easy, efficient and cost-effective manner.

SUMMARY

The following presents a simplified summary in order to provide a basic understanding of one or more aspects of the disclosure. This summary is not an extensive overview, and is neither intended to identify key or critical elements, nor to delineate the scope thereof. Rather, the primary purpose of the summary is to present some concepts in a simplified form as a prelude to the more detailed description that is presented later.

In one embodiment, a method to evaluate optimum power transistor switching characteristics for determining reliability limitations in an RF oscillator circuit is disclosed. The method comprises providing a cross-coupled transistor circuit comprising a first transistor and a second transistor, and coupled to a resonant tank. The resonant tank can comprise a center-tap inductor and at least one capacitor. The method further comprises splitting the center-tap inductor into a plurality of inductors comprising a first inductor with a first output and a second inductor with a second output. The method further comprises coupling a third transistor to the first output and to the second output located between the first inductor and the second inductor, turning the third transistor off, and testing at least one DC characteristic of the first transistor and testing at least one DC characteristic of the second transistor.

In another embodiment, a circuit to allow analysis of the gate/drain stress characteristics in RF circuitry for determining reliability variation as a function of gate/drain voltage is presented. The circuit comprises a first transistor and a second transistor coupled in a cross-coupled configuration, wherein a first gate terminal of the first transistor is coupled to a second drain terminal of the second transistor, and a second gate terminal of the second transistor is coupled to a first drain terminal of the first transistor. The circuit further comprises a resonant tank comprising a center-tap inductor comprising a plurality of inductors comprising a first inductor comprising a first output and a second inductor comprising a second output, at least one capacitor, and a third transistor. The third transistor is coupled to the first inductor and to the second inductor therebetween.

The following description and annexed drawings set forth in detail certain illustrative aspects and implementations of the invention. These are indicative of but a few of the various ways in which the principles of the invention may be employed.

DETAILED DESCRIPTION

Figure 1:
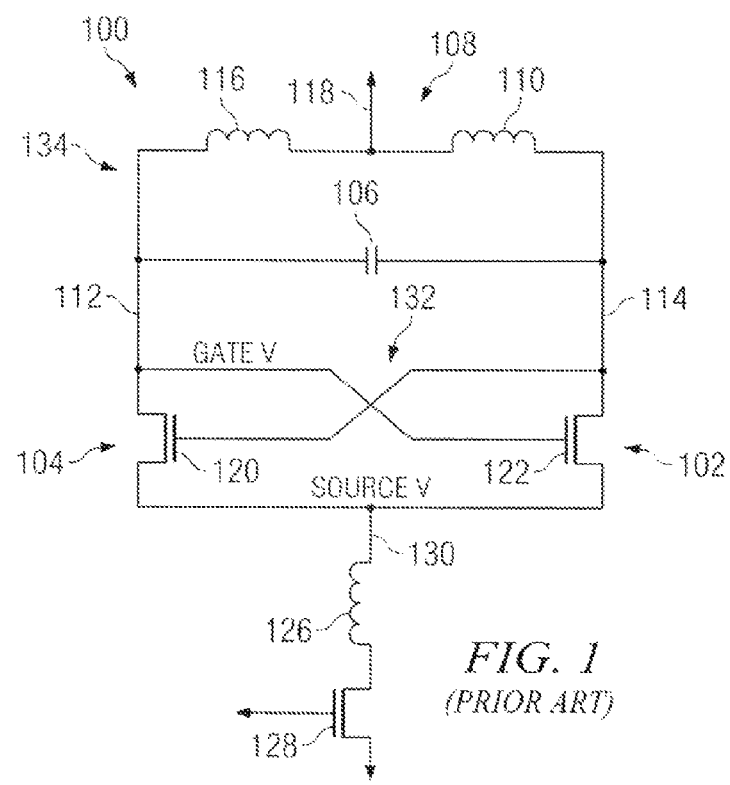
FIG. 1 is an illustration of an exemplary RF oscillator circuit.

While the making and using of various embodiments are discussed in detail below, it should be appreciated that the present disclosure provides many applicable concepts, which can be embodied in a wide variety of specific contexts. The present disclosure is hereafter illustratively described in conjunction with stress testing of transistor structures for the development of semiconductor process characterization or design rules. One or more embodiments of the present disclosure will now be described with reference to the attached drawings, wherein like reference numerals are used to refer to like elements throughout, and wherein the illustrated structures are not necessarily drawn to scale.

The present disclosure provides a versatile system, comprising a number of apparatus and methods, for decoupling variances in operational or behavioral parametric values during stress characterization. As described briefly hereinafter, complications can arise from parametric interdependencies inherent in many conventional characterization or test schemes. These interdependencies can result in subtle, if not greater, inaccuracies in extrapolations based on compiled characterization or test data. The system of the present invention effectively obviates such interdependencies, providing an accurate assessment of stress testing parameters.

For purposes of explanation and illustration, it is useful to understand certain aspects of an illustrative device characterization application, and some of the aforementioned issues that arise therein. Consider, for example, the formation of transistor structures utilizing CMOS processes, and the design libraries that must be specified for use with such processes. Among the most prevalent degradation mechanisms having a substantial impact on long-term device reliability are channel hot carrier (CHC) effects. This is especially true in deep submicron CMOS technologies, where transistor geometries—especially gate oxide thicknesses—are continually shrinking to achieve higher performance.

Operation of such device structures can generate very high electric fields (e.g., ~250 kV/cm) within certain device regions. As current flows from, for example, the source region of a transistor to the gate region, current carriers (i.e., electrons) passing through high electric fields within the substrate take on energy from the field(s). The highly energized (hot) carriers then proceed to and through a transistor's relatively thin and fragile gate oxide structure. With enough energy, the hot carriers can compromise or even destroy the gate oxide, or its interface to surrounding structures (e.g., the channel structure), degrading the integrity and performance of the transistor. Weaker transistors with slower switching characteristics, and of questionable reliability typically result.

This causes a number of problems when a device manufacturer is attempting to determine or specify operational conditions and lifetime of a device technology utilizing such a transistor. In attempts to address this, manufacturers must be able to quantify and qualify such degradation mechanisms and their effects in order to properly develop design and operation specifications for the technology.

In conventional methodologies, dynamic CHC transistor degradation models for reliability design rules can be generated utilizing CMOS ring oscillator (RO) circuitry. These RO circuits can comprise a number of inverter stages. Inverters can be used since they are one of the simplest transistor structures that can be formed having both CMOS technology types (i.e., NMOS and PMOS) in a single structure. Furthermore, in many cases, inverters comprise transistors—the very structure(s) that a manufacturer is interested in characterizing or modeling.

Inverter-based ROs self-generate a periodic input signal (e.g., a square wave), and output an inverse of the periodic signal. Hot carrier damage, if any, can occur when the transistors in an RO are switching state, due to the substrate current (i.e., high fields) generated during the transition period, or NBTI (Negative bias temperature instability) as an on-state DC stress on PMOS devices.

Another oscillator type, the design of RF (L-C) Oscillators, where typically just NMOS devices are used, does easily lend itself to simple measurement of the individual transistors in the circuit, following stress conditions. This is because under DC evaluation conditions the inductors behave like wires, leaving the drain terminals and gate terminals of both devices connected together and the source terminals likewise connected together.

In particular, transistors of an RF oscillator may be arranged in a cross-coupled arrangement, such as in a cross-coupled transistor pair. Evaluating each transistor independently can be necessary to ensure guarantees of the products matching balance among the cross-coupled transistor pair, as well as rates of degradation and duration of operative lifetimes of each transistor.

Without the aid of the present invention, most conventional characterization systems test the DC characteristics only by disconnecting the transistors of LC oscillator circuit from each other. Several disconnection sites have been contemplated, but all provide issues, such as introducing probe and bond capacitance and inductance into the circuitry that significantly impacts performance.

In contrast, the present invention recognizes the need to keep intact transistor connections of an RF oscillator while providing a method and apparatus for independently evaluating the effects of stress on individual transistors in the oscillator. In response, the present invention provides a segregated test circuitry and methodology that effectively isolates a sample structure in such a way that particular operational or behavioral characteristics of interest may be evaluated independently.

Referring now to FIG. 1, illustrates an exemplary RF circuit 100 that is an RF oscillator circuit. The circuit 100 is an example of an RF oscillator circuit 100 that is a digitally controlled oscillator comprising a cross-coupled pair 132 of transistors. The cross-coupled pair 132 comprises a transistor 102 and a transistor 104 connected together at their respective source terminal 130.

The example of an RF oscillator circuit 100 illustrated in FIG. 1 is a variety of resonant circuit or tuned circuit and comprises an inductor 108, which is often represented by the letter L, and a capacitor 106, often represented by the letter C. In the particular example of FIG. 1, the inductor 108 is a center-tap inductor 108 that can comprise a plurality of inductors, such as inductor 110 and inductor 116. The center-tap inductor 108 further comprises a center tap output terminal 118 at about the center of the inductor 108 for an output to flow there from.

When the capacitor 106 and inductor 108 are connected together an LC circuit 134 is formed as a resonant tank, part of the RF oscillator circuit 100. Consequently, an electric current can alternate between the capacitor 106 and inductor 108 at the circuit's resonant frequency. Such L-C circuits or resonant tanks can be used either for generating signals at a particular frequency, or picking out a signal at a particular frequency from a more complex signal. They can be key components in many applications such as oscillators, filters, tuners and frequency mixers. The LC circuit 134 assumes there is no dissipation of energy due to resistance, such as in a RLC circuit, which is a model incorporating resistance. The oscillator circuit 100 is only one model illustrated herein that can be implemented in an RF oscillator circuit as one of ordinary skill in the art would recognize.

The LC circuit 134 can store electrical energy vibrating at its resonant frequency. The capacitor 106 stores energy in the electric field between its plates, depending on the voltage across it, and the inductor 108 stores energy in its magnetic field, depending on the current through it. If the capacitor 106 is charged and connected across the inductor 108, charge will start to flow through the inductor 108, building up a magnetic field around it, and reducing the voltage on the capacitor 106. Eventually all the charge on the capacitor 106 will be gone. However, the current continues, because as an inherent function the inductor 108 resists changes in current, and energy will be extracted from the magnetic field to keep it flowing. The current will begin to charge the capacitor 106 with a voltage of opposite polarity to its original charge. When the magnetic field is completely dissipated the current will stop and the charge will again be stored in the capacitor 106 (with the opposite polarity) and the cycle will begin again, with the current in the opposite direction. The charge flows back and forth between the plates of the capacitor 106, through the inductor 108. The energy oscillates back and forth between the capacitor 106 and the inductor 108 until (if not replenished by power from an external circuit) internal resistance makes the oscillations die out.

FIG. 1 illustrates the LC circuit 134 coupled to a drain terminal 11 2 of transistor 104 and a drain terminal 114 of transistor 102. The transistor 104 comprises a gate terminal 120 coupled to the drain terminal 114 of transistor 102. The transistor 102 comprises a gate terminal 122 coupled to the drain terminal 112 of transistor 104. Thus, the transistors 104 and 102 form the cross-coupled pair 132. Respective transistors amplify the oscillations formed by the LC circuit 134. While one transistor turns on the other transistor in the cross-coupled pair, for example, is turned off. The transistor turned on charges the inductor 108. Once a certain saturation point is reached, the transistor devices switch, thus generating a waveform, such as a sin wave or square wave, for example.

A resonance effect occurs when inductive and capacitive reactances are equal (e.g., the resonant frequency). Notice that the LC circuit does not, by itself, resonate. The word resonance refers to a class of phenomena in which a small driving perturbation gives rise to a large effect in the system. The LC circuit must be driven, for example by an AC power supply, for resonance to occur. For example, the inductor 126 and amplifier 128 may be coupled to further circuitry (not shown) for providing a driving perturbation at the source voltage terminal 130.

Although circuit 100 can be a useful device, the design does not easily lend itself to measurement of the individual transistors 102 and 104 within the cross-coupled pair. Thus, it can be difficult to predict degradation following stress conditions applied during implementation.

Figure 2:
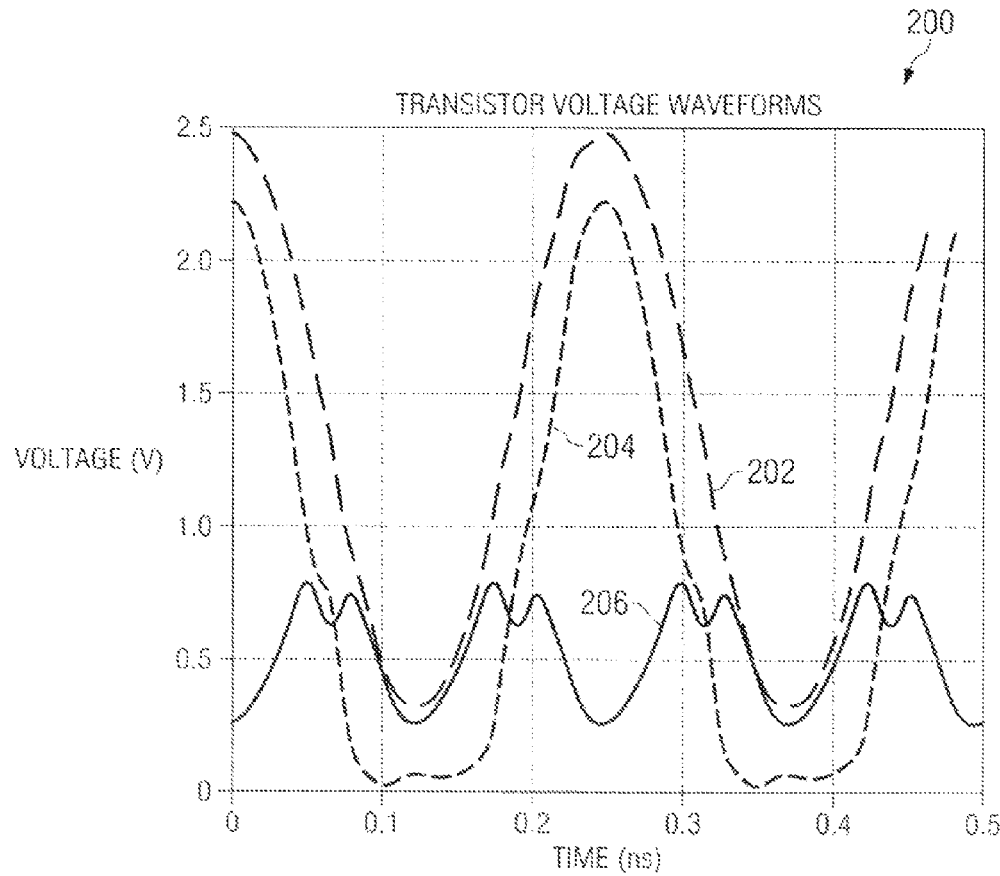
FIG. 2 is a waveform diagram of transistor voltages within the exemplary RF oscillator circuit of FIG. 1.

FIG. 2 illustrates an example of transistor voltage waveforms 200 as generated by the RF oscillator circuit 100. Even under normal operating conditions the gate terminals 120, 122 and drain terminals 112, 114 of respective transistors 102, 104 can be subject to extreme voltage conditions, which can be approximately as high as two times the supply voltage at source voltage terminal 130. For example, a waveform 202 depicts the voltage swing at the gate terminals 120, 122. The voltage swing can be from approximately 2.5 volts to zero volts, compared to approximately 0.5 volts to zero volts at a source voltage waveform 206 at the source terminal 130. The voltage between the gate terminal and source terminal is illustrated as a waveform 204.

The gate voltage waveform 202 is 180 degrees out of phase from a drain voltage (not shown). The gate voltage waveform 202 can be located at either one of the gate terminals 120, 122. While the gate voltage 202 of one transistor device in the cross-coupled pair is at one particular voltage, the drain voltage is the voltage at the gate of the other transistor device. Thus, an equal and opposite waveform is generated for the drain voltage (not shown), than the waveform for the gate voltage.

The extreme voltage conditions imposed upon the transistor devices 102, 104 of the cross-coupled pair 132 can cause the pair of transistors to degrade at various rates. This can be detrimental where the matching of the transistor devices within the pair is essential for implementations of the circuit. Measuring such mismatch and degradation patterns is therefore necessary for adequate modeling and behavior prediction.

Figure 3:
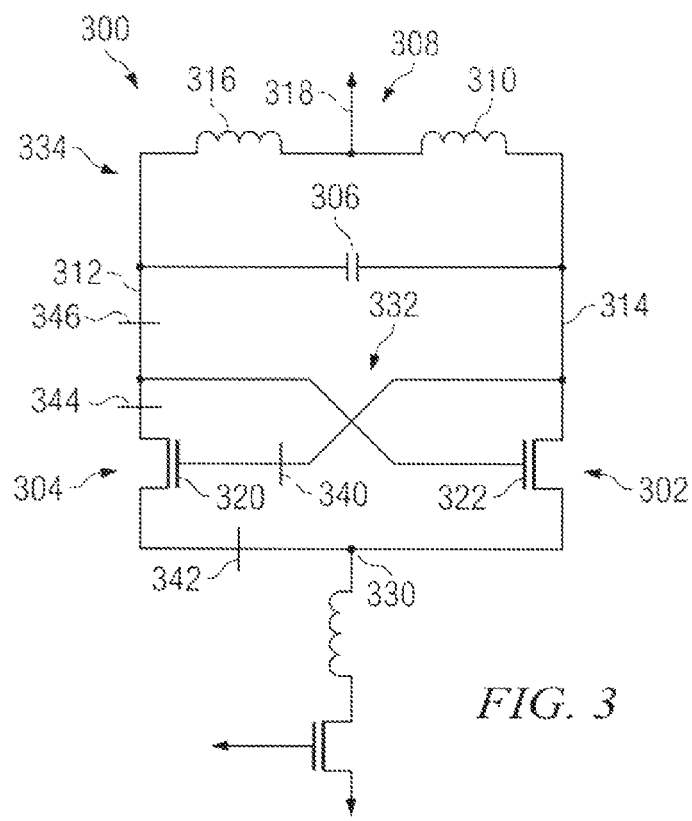
FIG. 3 is an illustration of an exemplary RF oscillator circuit.

Turning now to FIG. 3, illustrates an RF oscillator circuit 300 similar to the RF oscillator circuit depicted in FIG. 1 as one example of oscillator circuitry. Hatch marks 340, 342, 344, 346 are shown indicating various places where the circuit transistor devices could be disconnected for testing DC characteristics of the individual transistor devices 302 and 304. Although depicted on one side of the cross-coupled pair 332 comprising transistors 302 and 304, the hatch marks 340, 342, 344, 346 could be depicted on the other side surrounding the transistor device 302, for example. These DC characteristics (e.g., I-V characteristics) can provide indicators for measuring degradation throughout the device's operational life.

The circuit 300 comprises the cross-coupled pair 332 of transistors 302 and 304 coupled together at their respective source terminal 330. The oscillator circuit 300 further comprises a resonant tank or LC circuit 334 comprising an inductor 308 and a capacitor 306. The inductor 308 is a center-tap inductor 308 that can comprise a plurality of inductors, such as inductor 310 and inductor 316. The center-tap inductor 308 further comprises a center tap output terminal 318 at about the center of the inductor 308 for an output to flow there from.

The resonant tank or LC circuit 334 can be coupled to a drain terminal 312 of transistor device 304 and a drain terminal 314 of transistor 302. The transistor 304 comprises a gate terminal 320 coupled to the drain terminal 314 of transistor 302. The transistor 302 comprises a gate terminal 322 coupled to the drain terminal 312 of transistor 304.

Generally, the design of RF oscillator circuits does not lend itself to easy measurement of individual transistors, such as the transistor 302 or transistor 304. The reasons for this can be many, but in particular the inductors of an oscillator circuit behave like wires under DC conditions, leaving the drains and gates of both devices connected together, as well as the sources connected to each other. Thus, there are few good places in the circuit 300 to measure the degradation of the individual transistor devices with repetitive oscillator cycles. Currently, the diode voltage in DC can be measured in the circuit 300 between the gate at hatch mark 340, the drain at hatch marks 344, the drain and gate at 346, and the source at hatch mark 342. However, any one of these places can be either a high current node and/or sensitive to capacitance that the circuit 300 may receive with any kind of electronic switch therein.

For example, to test the DC characteristics of the transistors in the LC oscillator circuit 300 it is necessary to disconnect the transistors from each other at certain points represented by the hatch marks 340, 342, 344, and 346. However, all of these points can be problematic. Switching the gate 320 on/off at hatch mark 340 can leave the transistor device 304 floating. Switching the drain 312 on/off at hatch mark 344 can place resistance in the drain path, loading the circuitry and reducing circuit Q (i.e., quality factor or a measure of goodness of a resonant circuit). Switching the sources at hatch mark 342 is similar to switching the drain, affecting circuit Q. Switching the drain 312 of device 304 and gate 322 of device 302 together only permits measurement of off-state leakage of the transistor device 302.

Figure 4:
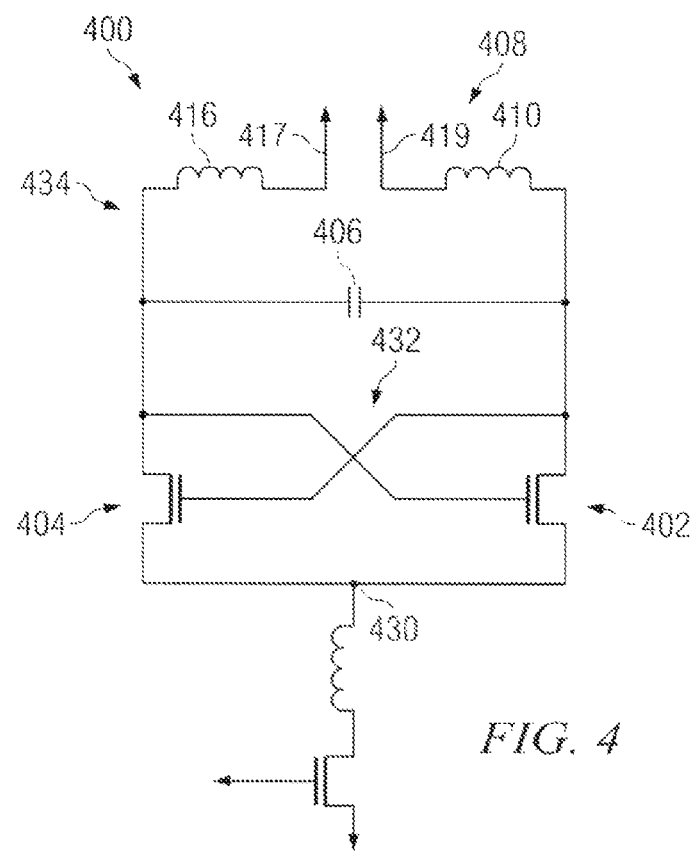
FIG. 4 is an illustration of an exemplary RF oscillator circuit.

FIG. 4 illustrates an exemplary place that DC characteristic measurements can be taken for measuring degradation within an RF oscillator circuit 400. Similar to FIG. 3, a resonant circuit 434 comprises a center-tap inductor 408 that comprises a plurality of inductors, such as inductors 410 and 416, and capacitor 406. The resonant circuit 434 can be coupled to a coupled-pair 432 of transistor devices comprising transistor devices 402 and 404.

The center-tap inductor 408 can be split to provide two different outputs 417 and 419. This provides one additional place of testing (at Vdd) for at least one DC characteristic of the transistor 402 and/or the transistor 404. By having the center—tap inductor 408 output from two different output paths 417 and 419 a more accurate reading can be made of the circuit characteristics. The two output paths 417 and 419 can be taken out of two different bond paths. However, splitting the resonant circuit at the center-tap inductor can be problematic, as it introduces probe and bond capacitance and inductance into the circuit that can significantly impact performance. Both output paths 417 and 419, for example, may be probed with regular probes for measuring the circuit characteristics, however, splitting the inductor 408 can add extra inductance and capacitance into the RF resonant circuit 400, which results in getting the wrong frequency.

Unlike the circuit 300 in FIG. 3, the circuit 400 provides the right frequency because it is perfectly balanced. The output path 418 has a constant voltage and can be treated as a DC condition with the path acting as a virtual ground for the voltage (Vdd) thereon. This obviates concern for any extra capacitance or inductance because the voltage thereon is not moving around or fluctuating.

By splitting the center-tap inductor 408, a better analysis of respective transistors 402 and 404 could be made in the circuit 400, provided that the circuit 400 would be able to provide the correct frequency for implementation. For example, a similar analysis of each individual the transistor 402 and 404 could be performed because a voltage (not shown) could independently be applied for the transistor device 402 and/or the transistor device 404 at respective inductor paths 417, 419. Voltages at each path 417, 419 could be raised independently. So a voltage at the transistor device 402 could be kept at zero volts, for example, while a voltage at the transistor device 404 could be increased.

In this manner, the leakage of the transistors could be examined independently, for example. The voltage at transistor device 404 could be raised to find out what the current looks like through that device and that particular side of the cross-coupled pair 432. Eventually the device becomes unstable as the voltages rise, but some conditions can be examined where the transistor device 404, for example, is 0.1 volt, or the transistor device 404 could be raised all the way up to a supply voltage 430 to examine the ideal end condition, which is the most sensitive condition.

Figure 5:
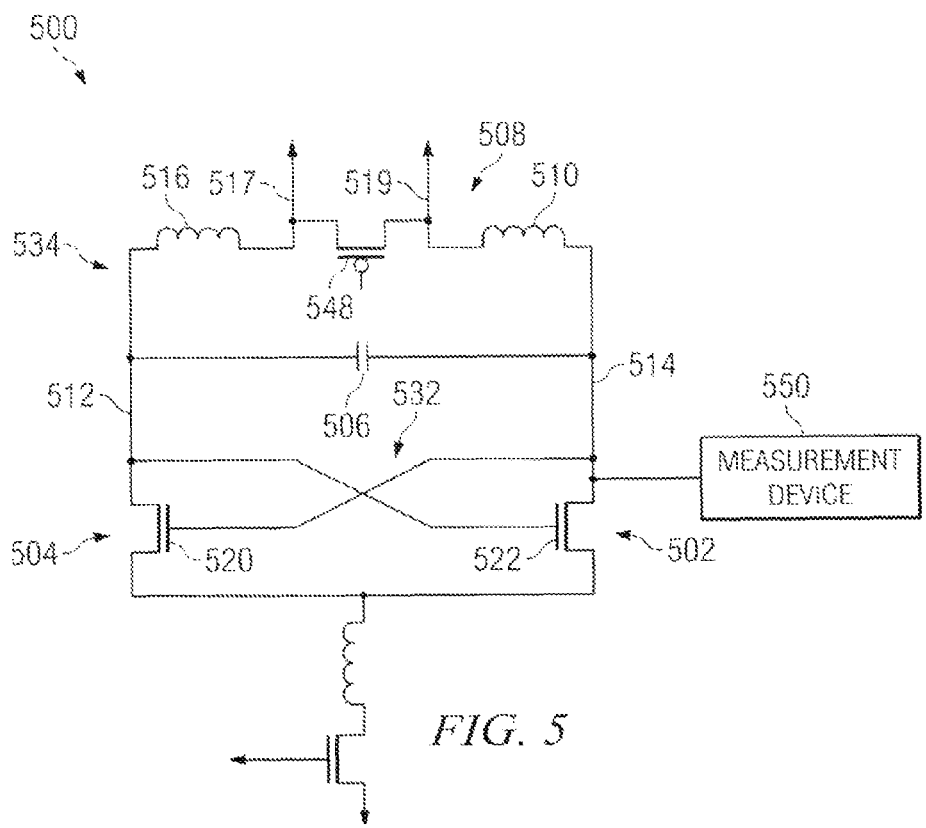
FIG. 5 is an illustration of an exemplary RF oscillator circuit.

Referring now to FIG. 5, is an example of one RF oscillator circuit 500 operable to allow analysis of stress characteristics in RF circuitry for determining reliability variations throughout the life of the circuit. For example, the gate/drain stress characteristics can be determined for examining how reliability of the circuit varies as a function of gate/drain voltage. Each transistor can be examined independently while the circuit 500 is operable to provide a reliable frequency for implementation.

The circuit 500 comprises a resonant tank 534. The resonant tank comprises a center-tap inductor 508 that comprises a plurality of inductors, such as inductors 510 and 516, and is coupled to a capacitor 506 in a parallel configuration. The resonant circuit 534 can be coupled to a coupled-pair 532 of transistor devices 502 and 504 at their respective drain terminals 512, 514. The cross-coupled pair 532 of devices 502 and 504 are cross-coupled at their gate terminals 522 and 520 respectively. The gate terminal 522 is coupled to the drain terminal 512 of transistor 504, and the gate terminal 520 of transistor 504 is coupled to the drain terminal 514 of transistor 502.

The center-tap inductor 508 is split to provide two different terminal paths 517 and 519 for applying a voltage. Coupled between the terminal paths 517 and 519 is a MOSFET or MOS device 548. The MOSFET device can be a pMOS transistor or an nMOS transistor device, for example. The MOS device 548 helps to obviate any concern that was inherent with FIG. 4 of the circuit 400 not being able to provide the correct or reliable frequency. When the circuit 500 is not oscillating the individual transistors 502 and/or 504 can be examined for evaluating the effects of stress on the circuit 500. This can be done when the device 548 is switched off, for example, and the two device output terminal paths 517 and 519 act separately to one another.

When the MOS device 548 turns on the paths 517 and 519 become effectively shorted and the circuit 500 operates as an oscillator circuit. For example, the paths 517 and 519 can appear effectively like they are shorted if the MOS device is large enough, which provides low impedance there between. The circuit therefore behaves like and LC resonant tank again.

The RF circuit 500 allows analysis the two transistors 502 and 504 independently without having to disconnect the circuit. Testing can therefore be performed on each transistor for verifying and determining degradation, which allows for reliability assurances and observation of how reliability varies between the transistors. In addition, time zero conditions (e.g., device conditions before any implementation) can be seen. One of the degradation characteristics that can be determined is whether an RF circuit is going to be more susceptible to one of the transistor devices over stressing or if it will move toward a balance after starting off on balance or not. The mismatch, if any, can also be determined in between the transistor devices before any implementation. Further, measurements of the circuit can be taken from a measurement device 550, which can be used for determining DC characteristics and/or I-V characteristics of the respective devices. For example, the gate/drain current and/or voltage stress characteristics can be determined as a function of gate/drain voltage.

Figure 6:
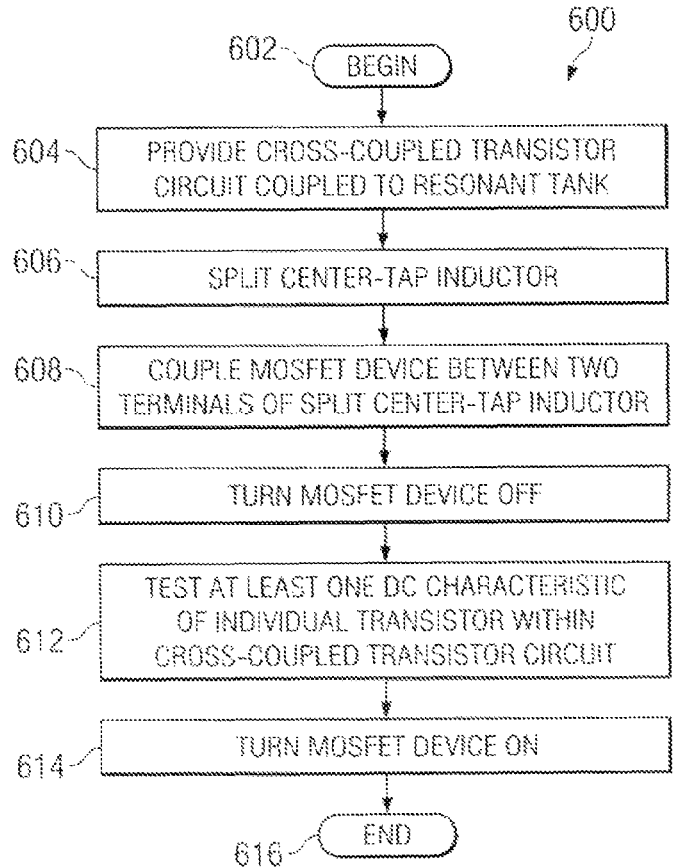
FIG. 6 s a flow chart diagram illustrating an exemplary methodology for forming an RF oscillator circuit and measuring degradation therein.

Referring now to FIG. 6, illustrates a method 600 for determining optimum power transistor switching characteristics for determining reliability limitations within an RF oscillator circuit. Although the method 600 and other methods herein are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

The exemplary method 600 is described hereinafter in the context of an RF oscillator circuit provided with a resonant tank. Any resonant tank design can be embodied as one of ordinary skill in the art can appreciate. The method initializes at 602 and continues at 604 comprising providing a cross-coupled transistor circuit coupled to the resonant tank. In one embodiment, the resonant tank can comprise a center-tap inductor in parallel with a capacitor. The cross-coupled transistor circuit can comprise two transistors cross-coupled together wherein the gate of a first transistor is coupled to the drain of a second transistor, and a gate of the second transistor is coupled to a drain of the first transistor. The resonant circuit can, for example, be coupled to the drains of respective first and second transistors of the cross-coupled pair.

At 606 the center-tap inductor is split wherein a plurality of inductors are provided with pathway terminals running there from. At 608 a MOSFET device is coupled there between the pathway terminals running from the inductors of the center-tap inductor. The MOSFET device can comprise a pMOS device or an nMOS device, for example. At 610 the MOSFET device can be turned off, thereby effectively separating the terminals and to allow for separate measurement of at least one DC characteristic of one transistor within the cross-coupled transistor circuit within the RF oscillator circuit at 612. The DC characteristics measured can be degradation of one of the transistors within the cross-coupled circuit pair. For example, I-V characteristics under DC conditions can be measured and used for evaluating the reliability of the circuit transistor devices.

Testing can be performed on each transistor independently for verifying and/or determining degradation, which allows for reliability assurances and observation of how reliability varies between the transistors. In addition, time zero conditions (e.g., device conditions before any implementation) can be seen. One of the degradation characteristics that can be determined is whether an RF circuit is going to be more susceptible to one of the transistor devices over stressing or if it will move toward a balance after starting off on balance or not. The mismatch, if any, can also be determined in between the transistor devices before any implementation.

In one embodiment, testing the DC characteristic of a first transistor and of a second transistor of the cross-coupled pair of transistors comprises testing the DC characteristic of the first transistor while the second transistor is off, and testing the DC characteristic of the second transistor while the first transistor is off. For example, the DC characteristic can comprise a leakage of the transistors respectively.

The MOSFET device can be turned on at 614, which allows for operation within an implementation of the RF oscillator circuit. At 616 the method finalizes.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method to evaluate optimum power transistor switching characteristics for determining reliability limitations in an RF oscillator circuit, the method comprising:
    providing a cross-coupled transistor circuit comprising a first transistor and a second transistor, and coupled to a resonant tank, wherein the resonant tank comprises a center-tap inductor and at least one capacitor;
    splitting the center-tap inductor into a plurality of inductors comprising a first inductor with a first output and a second inductor with a second output;
    coupling a third transistor to the first output and to the second output located between the first inductor and the second inductor;
    turning the third transistor off; and
    testing at least one DC characteristic of the first transistor and testing at least one DC characteristic of the second transistor.

2. The method of claim 1, further comprising turning the third transistor on for operation as an RF oscillator circuit.

3. The method of claim 1, wherein testing the at least one DC characteristic comprises determining a degradation of the first transistor and a degradation of the second transistor.

4. The method of claim 1, wherein testing at least one DC characteristic of the first transistor and of the second transistor comprises testing at least one DC characteristic of the first transistor while the second transistor is off, and testing at least one DC characteristic of the second transistor while the first transistor is off, and wherein the DC characteristic comprise a leakage of the first transistor and the second transistor respectively.

5. The method of claim 1, wherein testing at least one DC characteristic is performed independently of the second transistor when the first transistor is being tested, and performed independently of the first transistor when the second transistor is being tested, and wherein testing does not introduce any additional capacitances and inductances.

6. The method of claim 1, wherein the third transistor comprises a MOSFET device.

7. The method of claim 1, further comprising determining a product defined mismatch between the first transistor and the second transistor before any stress voltage application has been applied.

8. The method claim 1, wherein the DC characteristic comprises a gate/drain stress characteristic determining reliability variation as a function of gate/drain voltage.

9. A circuit to allow analysis of stress characteristics in RF circuitry for determining reliability variation as a function of voltage, comprising:
   a first transistor and a second transistor coupled in a cross-coupled configuration, wherein a first gate terminal of the first transistor is coupled to a second drain terminal of the second transistor, and a second gate terminal of the second transistor is coupled to a first drain terminal of the first transistor;
   a resonant tank comprising a center-tap inductor comprising a plurality of inductors comprising a first inductor comprising a first output and a second inductor comprising a second output, at least one capacitor, and a third transistor;
   wherein the third transistor is coupled to the first inductor and to the second inductor; and
   further comprising a measurement device coupled to the first output of the first inductor or the second output of the second inductor, and configured to measure a degradation characteristic of the first transistor independent of the second transistor, and to measure a degradation of the second transistor independent of the first transistor.

10. The circuit of claim 9, wherein the degradation characteristic measured comprises a gate/drain stress characteristic as a function of gate/drain voltage for determining reliability variation.

11. A circuit to allow analysis of stress characteristics in RF circuitry for determining reliability variation as a function of voltage, comprising:
   a first transistor and a second transistor coupled in a cross-coupled configuration, wherein a first gate terminal of the first transistor is coupled to a second drain terminal of the second transistor, and a second gate terminal of the second transistor is coupled to a first drain terminal of the first transistor;
   a center-tap inductor comprising a plurality of inductors comprising a first inductor comprising a first output and a second inductor comprising a second output;
   a capacitor; and
   a third transistor;
   wherein the third transistor is coupled to the first inductor and to the second inductor; and
   further comprising a measurement device coupled to the first output of the first inductor or the second output of the second inductor, and configured to measure a degradation characteristic of the first transistor independent of the second transistor, and to measure a degradation of the second transistor independent of the first transistor.

12. The circuit of claim 11, wherein the degradation characteristic measured comprises a gate/drain stress characteristic as a function of gate/drain voltage for determining reliability variation.

* * * * *

UNITED STATES PATENT AND TRADEMARK OFFICE
CERTIFICATE OF CORRECTION

PATENT NO. : 7,808,266 B2  Page 1 of 1
APPLICATION NO. : 12/352795
DATED : October 5, 2010
INVENTOR(S) : Andrew Marshall and Srikanth Krishnan It is certified that error appears in the above-identified patent and that said Letters Patent is hereby corrected as shown below:

Title page, item [75] inventor: should read --Andrew Marshall--

Signed and Sealed this

Fourteenth Day of December, 2010

David J. Kappos
*Director of the United States Patent and Trademark Office*